United States Patent
Dobashi et al.

(10) Patent No.: US 9,214,364 B2
(45) Date of Patent: Dec. 15, 2015

(54) SUBSTRATE CLEANING APPARATUS AND VACUUM PROCESSING SYSTEM

(75) Inventors: Kazuya Dobashi, Nirasaki (JP); Kensuke Inai, Nirasaki (JP); Akitaka Shimizu, Nirasaki (JP); Kenta Yasuda, Nirasaki (JP); Yu Yoshino, Moriyama (JP); Toshihiro Aida, Tokyo (JP); Takehiko Senoo, Osaka (JP)

(73) Assignees: TOKYO ELECTRON LIMITED, Tokyo (JP); IWATANI CORPORATION, Osaka-shi (JP)

( * ) Notice: Subject to any disclaimer, the term of this patent is extended or adjusted under 35 U.S.C. 154(b) by 530 days.

(21) Appl. No.: 13/429,720

(22) Filed: Mar. 26, 2012

(65) Prior Publication Data

US 2012/0247670 A1  Oct. 4, 2012

(30) Foreign Application Priority Data

Mar. 31, 2011 (JP) ................................ 2011-080098

(51) Int. Cl.
*H01L 21/67* (2006.01)
*C23C 16/455* (2006.01)
*H01J 37/32* (2006.01)

(52) U.S. Cl.
CPC .... *H01L 21/67028* (2013.01); *C23C 16/45563* (2013.01); *C23C 16/45574* (2013.01); *C23C 16/45582* (2013.01); *C23C 16/45587* (2013.01); *H01L 21/67051* (2013.01); *H01J 37/321* (2013.01); *H01J 37/3244* (2013.01); *H01J 37/32449* (2013.01); *H01L 21/67069* (2013.01)

(58) Field of Classification Search
CPC .................. C23C 16/45563; C23C 16/45574; C23C 16/45582; C23C 16/45587; C23C 16/45565; H01J 37/3244; H01J 37/321; H01J 37/32449; H01L 21/67069
USPC ......................... 118/715; 156/345.33, 345.29
See application file for complete search history.

(56) References Cited

U.S. PATENT DOCUMENTS

| | | | | |
|---|---|---|---|---|
| 3,953,265 A * | 4/1976 | Hood | ................................ | 438/8 |
| 4,197,814 A * | 4/1980 | Takagi et al. | ................. | 118/726 |
| 4,799,454 A * | 1/1989 | Ito | ........................... | 118/723 CB |
| 4,805,555 A * | 2/1989 | Itoh | ................................ | 118/719 |
| 4,902,572 A * | 2/1990 | Horne et al. | .................. | 428/409 |
| 5,108,535 A * | 4/1992 | Ono et al. | ................. | 156/345.35 |
| 5,304,247 A * | 4/1994 | Kondo et al. | .................. | 118/715 |

(Continued)

FOREIGN PATENT DOCUMENTS

| JP | 08294679 A | * 11/1996 |
|---|---|---|
| JP | 2001-137797 | 5/2001 |

(Continued)

*Primary Examiner* — Rudy Zervigon
(74) *Attorney, Agent, or Firm* — Oblon, McClelland, Maier & Neustadt, L.L.P

(57) ABSTRACT

A substrate cleaning apparatus includes a supporting unit, provided in a processing chamber having a gas exhaust port, for supporting a substrate; one or more nozzle units, each for ejecting gas clusters to a peripheral portion of the substrate supported by the supporting unit to remove unnecessary substances from the peripheral portion; and a moving mechanism for changing relative positions of the supporting unit and the nozzle unit during ejecting the gas clusters. Each nozzle unit discharges a cleaning gas having a pressure higher than that in the processing chamber so that the cleaning gas is adiabatically expanded to form aggregates of atoms and/or molecules.

13 Claims, 11 Drawing Sheets

(56) References Cited

U.S. PATENT DOCUMENTS

| | | | |
|---|---|---|---|
| 5,525,158 A * | 6/1996 | Tsukazaki et al. | 118/723 CB |
| 5,679,167 A * | 10/1997 | Muehlberger | 118/723 DC |
| 5,967,156 A * | 10/1999 | Rose et al. | 134/7 |
| 6,114,254 A * | 9/2000 | Rolfson | 438/758 |
| 6,164,297 A | 12/2000 | Kamikawa | 134/61 |
| 6,203,406 B1 * | 3/2001 | Rose et al. | 451/39 |
| 6,263,829 B1 * | 7/2001 | Schneider et al. | 118/723 I |
| 6,267,853 B1 * | 7/2001 | Dordi et al. | 204/232 |
| 6,290,865 B1 * | 9/2001 | Lloyd et al. | 216/92 |
| 6,328,221 B1 * | 12/2001 | Moore et al. | 239/1 |
| 6,424,091 B1 * | 7/2002 | Sawada et al. | 315/111.81 |
| 6,669,809 B2 * | 12/2003 | Hashimoto et al. | 156/345.2 |
| 6,884,296 B2 * | 4/2005 | Basceri et al. | 118/715 |
| 7,017,281 B2 * | 3/2006 | Izumi | 34/565 |
| 7,067,097 B1 * | 6/2006 | Wojak | 423/446 |
| 7,258,124 B2 * | 8/2007 | Jeong et al. | 134/95.3 |
| 7,527,698 B2 * | 5/2009 | Holsteyns et al. | 134/26 |
| 7,578,886 B2 * | 8/2009 | Yamada et al. | 134/21 |
| 7,651,585 B2 * | 1/2010 | Yoon et al. | 156/345.43 |
| 7,691,278 B2 * | 4/2010 | Yoon et al. | 216/59 |
| 8,016,976 B2 * | 9/2011 | Kamei et al. | 156/345.55 |
| 8,100,081 B1 * | 1/2012 | Henri et al. | 118/723 R |
| 8,298,433 B2 * | 10/2012 | Yoon et al. | 216/67 |
| 8,394,201 B2 * | 3/2013 | Kim et al. | 118/715 |
| 8,453,600 B2 * | 6/2013 | Miyashita et al. | 118/723 I |
| 8,546,270 B2 * | 10/2013 | Kim et al. | 438/758 |
| 8,658,937 B2 * | 2/2014 | Harte et al. | 219/121.68 |
| 8,721,835 B2 * | 5/2014 | Kools | 156/345.34 |
| 8,883,027 B2 * | 11/2014 | Yoon et al. | 216/67 |
| 8,926,789 B2 * | 1/2015 | Yoon et al. | 156/345.31 |
| 2001/0051432 A1 | 12/2001 | Yano et al. | |
| 2003/0098040 A1 * | 5/2003 | Nam et al. | 134/1.3 |
| 2006/0112980 A1 * | 6/2006 | Jeong et al. | 134/137 |
| 2007/0066076 A1 * | 3/2007 | Bailey et al. | 438/710 |
| 2007/0068899 A1 * | 3/2007 | Yoon | 216/67 |
| 2007/0072432 A1 * | 3/2007 | Yoon et al. | 438/707 |
| 2008/0010845 A1 * | 1/2008 | Bailey et al. | 33/520 |
| 2008/0011332 A1 * | 1/2008 | Bailey et al. | 134/56 R |
| 2008/0011421 A1 * | 1/2008 | Bailey et al. | 156/345.1 |
| 2008/0017316 A1 * | 1/2008 | Bailey et al. | 156/345.29 |
| 2008/0073324 A1 * | 3/2008 | Nogami et al. | 216/58 |
| 2008/0236634 A1 | 10/2008 | Moriya et al. | |
| 2008/0289651 A1 | 11/2008 | Cheng et al. | |
| 2009/0084409 A1 * | 4/2009 | Okura et al. | 134/21 |
| 2010/0099265 A1 * | 4/2010 | Yoon et al. | 438/710 |
| 2010/0147327 A1 * | 6/2010 | Kondo et al. | 134/1 |
| 2010/0193708 A1 | 8/2010 | Tabat et al. | |
| 2010/0218791 A1 * | 9/2010 | Tanaka et al. | 134/30 |
| 2011/0147896 A1 | 6/2011 | Koike et al. | |
| 2011/0168672 A1 * | 7/2011 | Harte et al. | 216/65 |
| 2012/0071003 A1 * | 3/2012 | Dobashi et al. | 438/758 |
| 2012/0247670 A1 * | 10/2012 | Dobashi et al. | 156/345.31 |
| 2012/0298134 A1 * | 11/2012 | Moriya et al. | 134/1.1 |
| 2013/0255728 A1 * | 10/2013 | Noh | 134/26 |
| 2014/0065295 A1 * | 3/2014 | Emoto et al. | 427/8 |
| 2014/0130981 A1 * | 5/2014 | Benson | 156/345.55 |
| 2014/0166049 A1 * | 6/2014 | Kang et al. | 134/19 |

FOREIGN PATENT DOCUMENTS

| | | |
|---|---|---|
| JP | 2001-345294 | 12/2001 |
| JP | 2008-251743 | 10/2008 |
| WO | WO 2009/036218 | 3/2009 |
| WO | 2010/021265 A1 | 2/2010 |
| WO | WO 2010/021265 | 2/2010 |
| WO | WO 2010/090794 | 8/2010 |

* cited by examiner

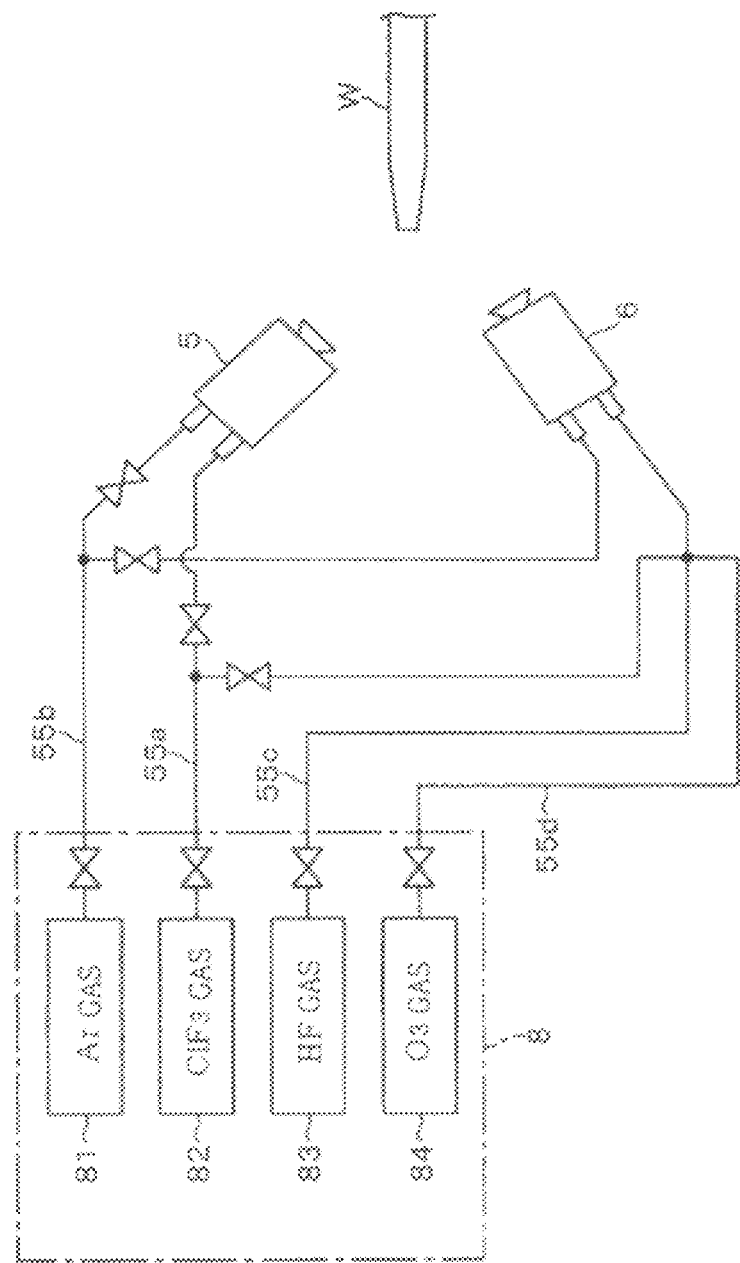

SUBSTRATE CLEANING APPARATUS AND VACUUM PROCESSING SYSTEM

CROSS-REFERENCE TO RELATED APPLICATIONS

This application claims priority to Japanese Patent Application No. 2011-080098 filed on Mar. 31, 2011, the entire contents of which are incorporated herein by reference.

FIELD OF THE INVENTION

The present invention relates to a technique for cleaning a peripheral portion of a substrate.

BACKGROUND OF THE INVENTION

In a semiconductor device manufacturing process, a process for forming a hole or a trench in laminated films formed on a semiconductor wafer (hereinafter, referred to as a "wafer") through a resist mask formed on the laminated films by using single etching apparatus is being examined, in which an etching gas corresponding to each film is employed. In such process, after the laminated films are formed on the wafer, a peripheral portion thereof is removed by a wet cleaning apparatus and, then, a resist pattern is formed on the remaining laminated films. Therefore, when the wafer is etched, silicon as a base material is exposed at the peripheral portion of the wafer. Accordingly, the silicon of the peripheral portion of the wafer is cut by the etching process, and acute protrusions of a needle shape are densely formed at the surface thereof. Since a plasma is not ejected on the peripheral portion of the backside of the wafer, a reaction product, e.g., polymer, generated by the reaction between the laminated films and the plasma on the wafer surface is deposited thereon, and thus undesired particles may be generated.

Acute silicon irregularities (the protrusions of needle shape) formed at the peripheral portion of the wafer surface are not easily removed by plasma cleaning due to the anisotropic property of the plasma of the cleaning gas. The protrusions cannot be scraped off by brush cleaning. Although the protrusions can be removed by CMP (Chemical Mechanical Polishing), the wafer surface may be contaminated. The deposit adhered to the peripheral portion of the backside of the wafer contains a plurality of materials. Hence, when dry cleaning (plasma cleaning) is performed, a cleaning gas needs to be changed depending on materials of the films. However, it is difficult to process only the peripheral portion of the wafer, and the device area of the wafer is damaged. When wet etching is performed, the same problems are generated, and the re-adhesion of the removed deposit occurs.

Meanwhile, International Patent Application Publication No. 2010/021265 (WO/2010/021265) describes a technique for etching or planarizing a semiconductor substrate or a thin film formed thereon by ejecting gas clusters thereto without ionizing the gas clusters. However, WO/2010/021265 does not describe a technique for cleaning the peripheral portion of the wafer.

SUMMARY OF THE INVENTION

In view of the above, the present invention provides a technique capable of cleaning unnecessary substances of a peripheral portion of a substrate while reducing adverse effect on an effective area of the substrate.

In accordance with one aspect of the present invention, there is provided a substrate cleaning apparatus includes a supporting unit, provided in a processing chamber having a gas exhaust port, for supporting a substrate; one or more nozzle units, each for ejecting gas clusters to a peripheral portion of the substrate supported by the supporting unit to remove unnecessary substances from the peripheral portion; and a moving mechanism for changing relative positions of the supporting unit and the nozzle unit during ejecting the gas clusters, wherein the nozzle unit discharges a cleaning gas having a pressure higher than that in the processing chamber so that the cleaning gas is adiabatically expanded to form aggregates of atoms and/or molecules.

In accordance with another aspect of the present invention, there is provided a vacuum processing system including: a vacuum transfer chamber for transferring a substrate in a vacuum atmosphere; a vacuum processing module, connected to the vacuum transfer chamber via a gate valve, for forming a thin film on a substrate or performing dry etching on a thin film formed on the surface of the substrate; and the substrate cleaning apparatus described in claim 1, connected to the vacuum transfer chamber via a gate valve, for cleaning a peripheral portion of the substrate subjected to a vacuum processing in the vacuum processing module.

In the present invention, the unnecessary substances of the peripheral portion of the substrate is removed by supplying the cleaning gas clusters (aggregates of atoms and/or molecules) generated by injecting the cleaning gas from the nozzle unit in a processing atmosphere having a pressure lower than that in the nozzle unit while relatively moving or rotating the substrate with respect to the nozzle unit. Since the gas clusters can be locally ejected, the unnecessary substances of the peripheral portion of the substrate which needs to be removed can be cleaned without affecting an effective area of the substrate such as a device area or the like and while reducing contamination of the substrate.

BRIEF DESCRIPTION OF THE DRAWINGS

The above and other objects and features of the present invention will become apparent from the following description of embodiments, given in conjunction with the accompanying drawings, in which:

FIG. 6 is a schematic diagram showing lines for explaining an outline of a gas supply system of the cluster nozzle;

DETAILED DESCRIPTION OF THE EMBODIMENTS

Figure 1:
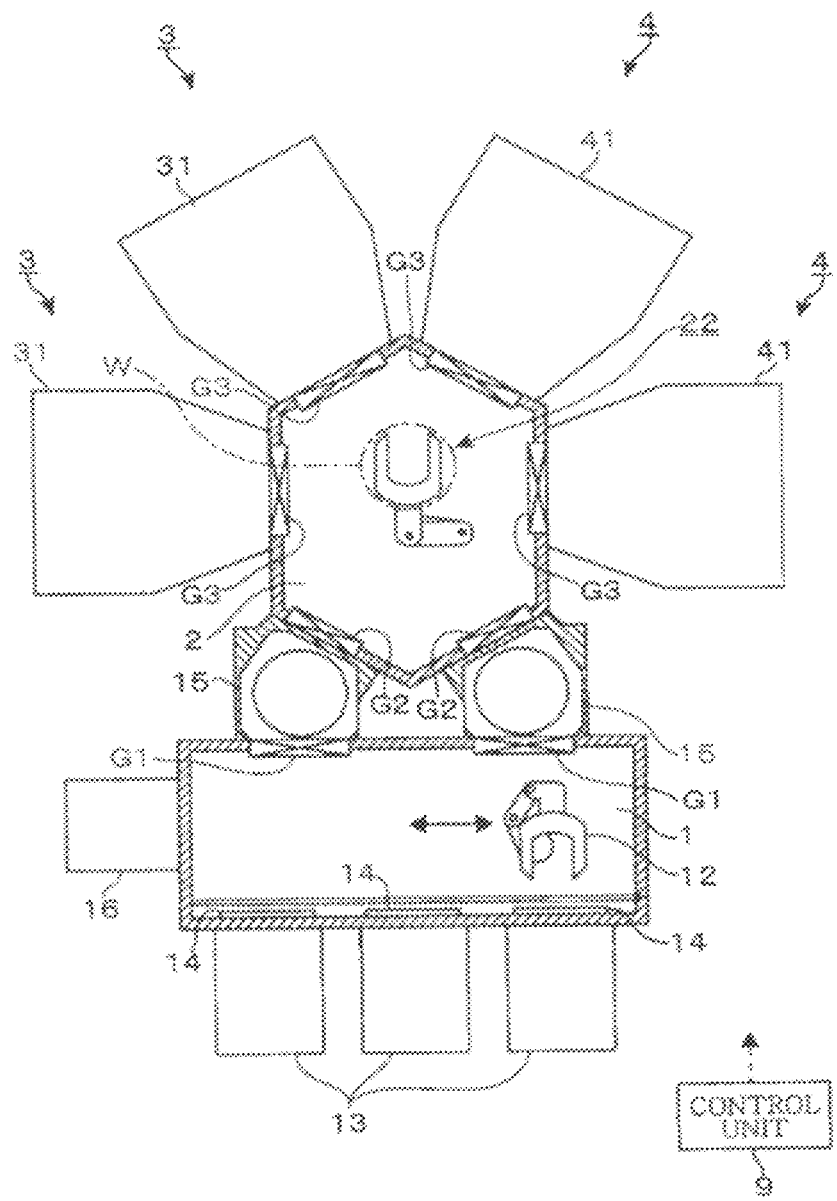
FIG. 1 is a top view showing an entire vacuum processing system in accordance with an embodiment of the present invention.

FIG. 1 shows a vacuum processing system having a substrate cleaning apparatus 4 in accordance with an embodiment of the present invention. The vacuum processing system includes an atmospheric transfer chamber 1 having a rectangular shape when seen from above. A loading/unloading port for loading and unloading a semiconductor (silicon) wafer is provided at one longitudinal side of the atmospheric transfer chamber 1. The loading/unloading port has a plurality of loading/unloading stages 13 for mounting thereon a FOUP (front opening unified pod) as a transfer container for accommodating a plurality of wafers W and doors 14 provided for the loading/unloading stages 13.

A vacuum transfer chamber 2 having a hexagonal shape when seen from above is connected, via a right and a left load-lock chamber 15 (preliminary vacuum chambers), to the other side of the atmospheric transfer chamber 1 which is opposite to the side where the loading/unloading stage 13 is provided. Connected to one short side of the atmospheric transfer chamber 1 is an alignment module 16 having an orienter for positioning the wafer W. Provided in the atmospheric transfer chamber 1 is a transfer mechanism 12 for transferring the wafer W between the loading/unloading stage 13, the load-lock chambers 15, and the alignment module 16.

The interior of the vacuum transfer chamber 2 is maintained at a vacuum atmosphere by a vacuum pump (not shown), and is connected to a first vacuum chamber 31 forming a processing atmosphere of the etching apparatus 3 and a second vacuum chamber 41 forming a processing atmosphere of the substrate cleaning apparatus 4. Further, the vacuum transfer chamber 2 has therein a transfer mechanism 22 for transferring the wafer W among the load-lock chamber 15, the etching apparatus 3 and the substrate cleaning apparatus 4. In FIG. 1, reference numerals G1 to G3 indicate gate valves.

The vacuum processing system includes a control unit 9. The transfer of the wafer W, the opening/closing of the doors 14 of the gate valves G1 to G3, the processing and the vacuum level in the vacuum chambers 31 and 41 are controlled by software including a processing recipe and a program stored in a storage unit of the control unit 9.

As for the etching apparatus 3, a known apparatus of a capacitively coupled plasma type or an induction coil plasma type can be used. In the capacitively coupled plasma etching apparatus, an upper and a lower electrode are provided so as to face each other in the vacuum chamber 31, and a processing gas is converted into a plasma by applying a high frequency power between both electrodes. Further, the surface of the wafer W is etched by attracting ions in the plasma to the wafer W on the lower electrode by the bias power applied to the lower electrode.

Figure 2:
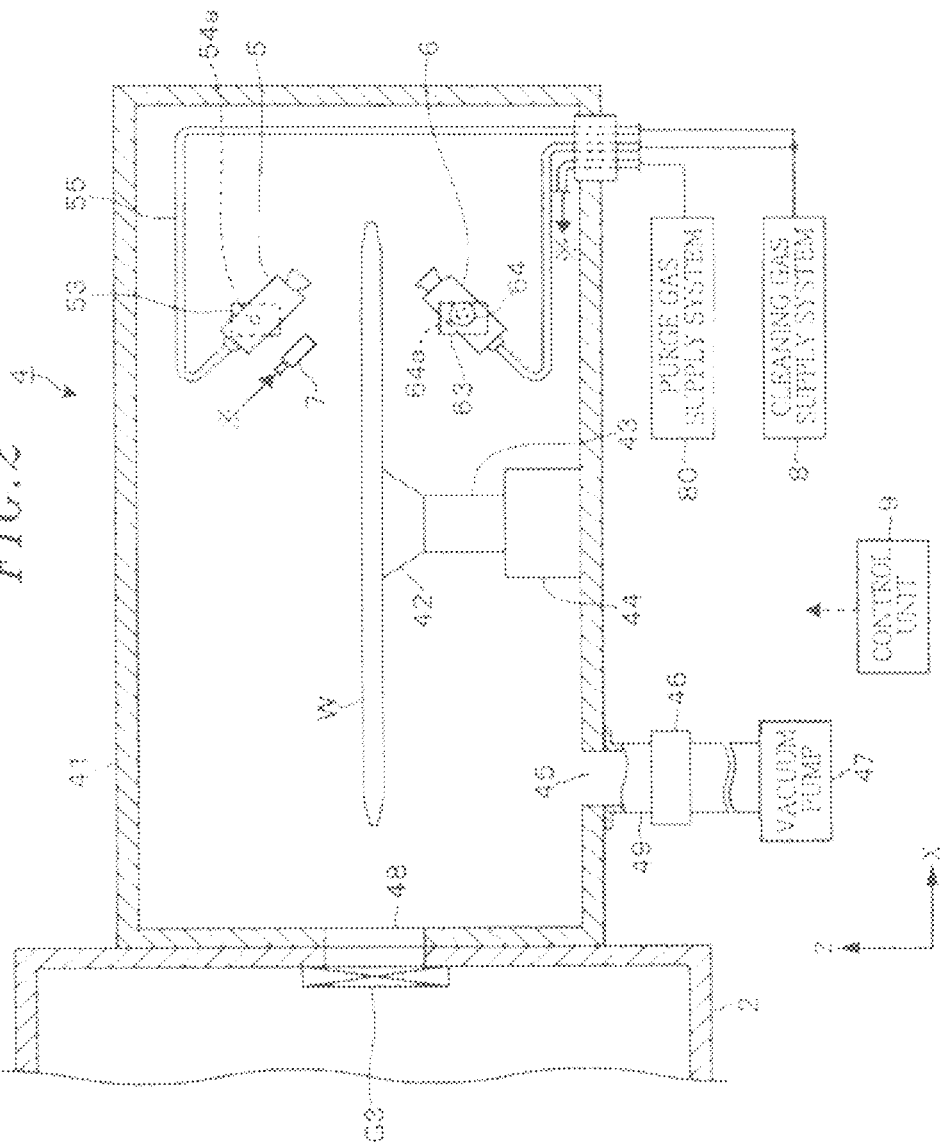
FIG. 2 is a vertical side view showing an outline of a substrate cleaning apparatus used in the embodiment of the present invention.

As shown in FIG. 2, the second vacuum chamber 41 of the substrate cleaning apparatus 4 includes an electrostatic chuck 42 for adsorptively holding the wafer W horizontally. The electrostatic chuck 42 is supported by a rotation mechanism 44 as a moving mechanism fixed to the bottom portion of the second vacuum chamber 41 via a rotation axis 43, and can rotate the wafer W adsorptively held thereon about the vertical axis.

Figure 3:
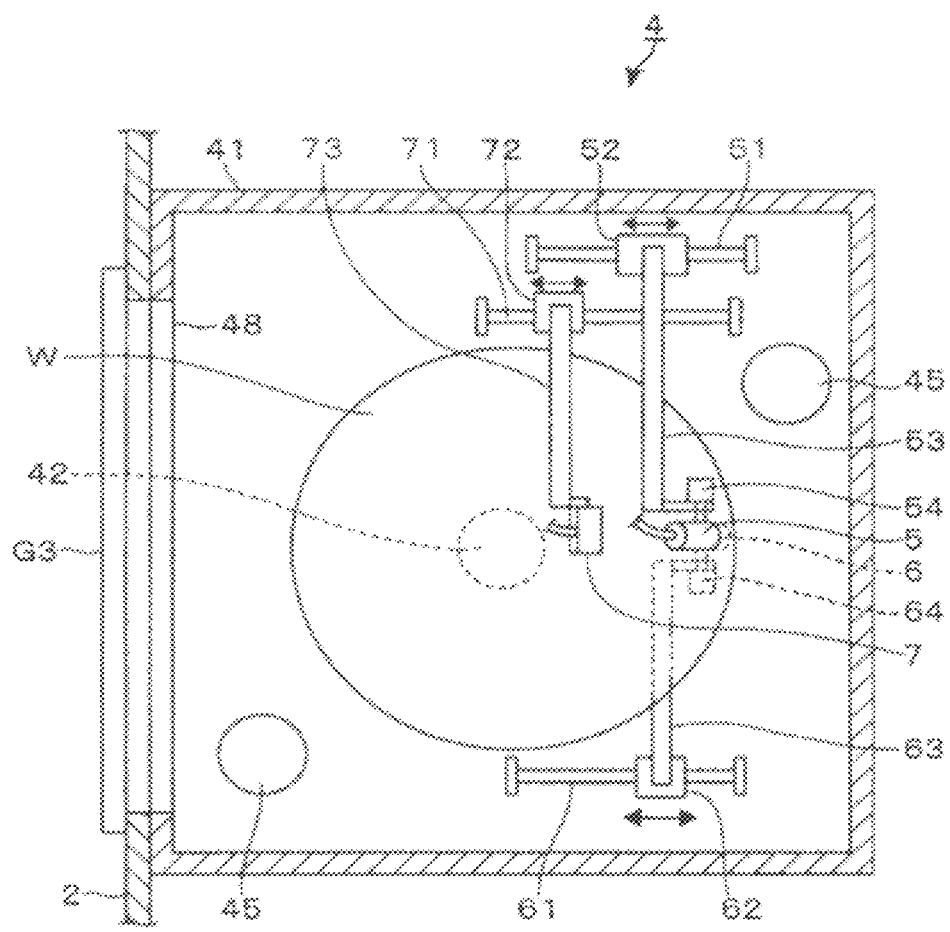
FIG. 3 is a top view showing an outline of the substrate cleaning apparatus.
Figure 4:
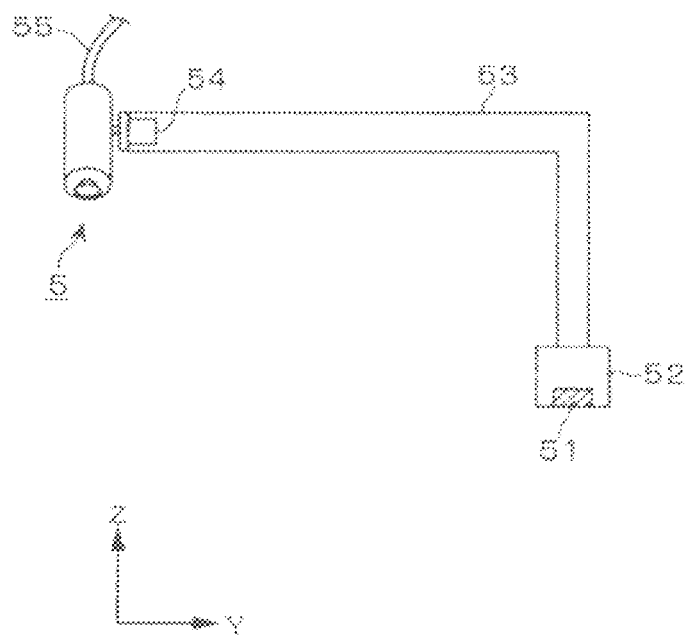
FIG. 4 is a vertical side view showing a cluster nozzle of the substrate cleaning apparatus.

As shown in FIG. 3, a guide 51 extending in a horizontal direction (X direction in FIG. 3) is provided near the sidewall of the bottom portion of the second vacuum chamber 41, and a moving body 52 is driven by a ball screw mechanism (not shown) while being guided by the guide 51. As shown in FIG. 4, a supporting member 53 is provided above the moving body 52 so as to extend vertically upward (Z direction in the drawing), bend at a right angle, and extend in a horizontal direction (Y direction in the drawing) perpendicular to the extension direction of the guide. The first cluster nozzle 5 is provided at the leading end of the supporting member 53 via an angle adjusting mechanism 54 so as to be positioned above the wafer W adsorptively held by the electrostatic chuck 42. The angle adjusting mechanism is configured as a driving mechanism including a motor having a rotation axis 54a extending in the Y direction. Since the first cluster nozzle 5 can be pivoted by the angle adjusting mechanism 54 about the rotation axis 54a, the ejecting angle of the gas clusters can be controlled.

Figure 5:
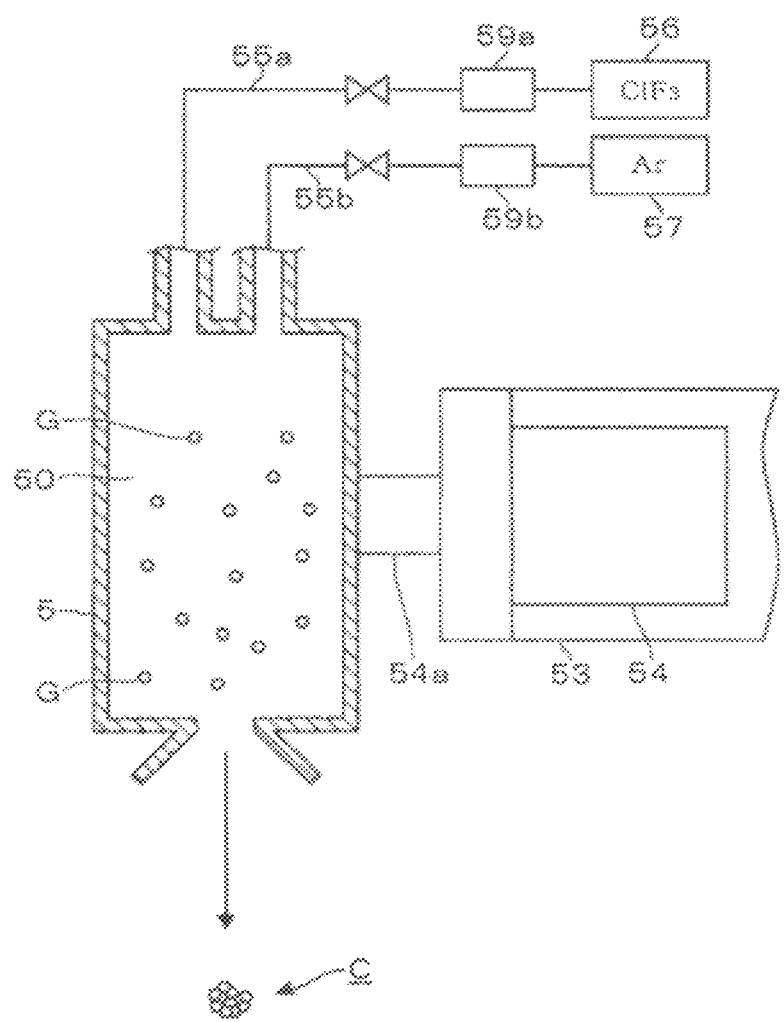
FIG. 5 is a vertical side view showing an outline of the cluster nozzle.

As shown in FIG. 5, the first cluster nozzle 5 has a cylindrical pressure chamber 50. A first and a second gas channel 55a and 55b, each being a line, are connected to the base end side of the first cluster nozzle 5. A chlorine trifluoride ($ClF_3$) gas supply source 56 is connected to the base end side of the first gas channel 55a, and a flow rate control unit 59a, e.g., a mass flow meter, and a valve are disposed therein. An Ar gas supply source 57 is connected to the base end side of the second gas channel 55b, and a flow rate controller 59b, e.g., a mass flow meter, and a valve are disposed therein. Although it is not illustrated, a pressure meter for detecting a pressure in the pressure chamber 50 is provided. Thus, a pressure in the pressure chamber 50 and a flow rate ratio of the $ClF_3$ gas and the Ar gas can be controlled by the flow rate control units 59a and 59b and the pressure meter.

The $ClF_3$ gas which is a main component of the gas clusters C ejected from the first cluster nozzle 5 can physically and chemically remove the needle-shaped silicon protrusions T and planarize the peripheral portion of the wafer W. The Ar gas as an inert gas is used as a pressure increasing gas for increasing a discharge velocity of the gas clusters C by increasing a pressure at a supply side of the first cluster nozzle 5 (pressure in the processing chamber 50) and improving directivity or local workability. Due to the increase in the pressure of the supply side of the first cluster nozzle 5, the pressure in the second vacuum chamber 41 can be increased. Thus, it is advantageous in that the level of vacuum performance required in the apparatus can be lowered. In FIG. 2, the first and the second gas channel 55a and 55b are illustrated as a line 55; and the $ClF_3$ gas supply source 56, the Ar gas supply source 57, the flow rate controllers 59a and 59b, the valves and the pressure meters connected thereto are illustrated as a cleaning gas supply system 8. The cleaning gas supply system 8 further includes a cleaning gas supply system used in a second cluster nozzle 6 which will be described later.

As shown in FIG. 5, the leading end side of the first cluster nozzle 5 is widened in a trumpet shape. A discharge port of the first cluster nozzle 5 which corresponds to the base portion of the widened portion is formed in an orifice shape. A height from the surface of the wafer W and a horizontal distance to a periphery of the wafer W to which the gas clusters C is ejected are set to, e.g., about 10 mm, respectively. As will be described later, the gas injected from the first cluster nozzle 5 is adiabatically expanded due to rapid depressurization, and atoms or molecules G of the processing gas are coupled by van der Waals force and form aggregates (gas clusters) C. The gas clusters C is ejected to the needle-shaped protrusions T formed at the peripheral portion of the wafer W.

Meanwhile, the second cluster nozzle 6 is provided below the wafer W in the second vacuum chamber 41 so as to eject gas clusters toward the peripheral portion of the wafer W. As shown in FIG. 3, a guide 61 for the second cluster nozzle 6 is provided in parallel with the guide 51 and faces the guide 51 with the electrostatic chuck 42 therebetween. A moving body 62 is driven by a ball screw mechanism (not shown) while being guided by the guide 61. A supporting member 63 is provided above the moving body 62 so as to extend vertically upward (Z direction in FIG. 2), bend at a right angle, and extend in a horizontal direction (Y direction in FIG. 3) perpendicular to the extension direction of the guide. The second cluster nozzle 6 is provided at the leading end portion of the supporting member 63 via an angle adjustment mechanism 64 so as to be positioned below the wafer W adsorptively held by the electrostatic chuck 42. The angle adjustment mechanism 64 is a driving mechanism including a motor having a rotation axis 64a extending in the Y direction. Since the second cluster nozzle 6 can be pivoted by the angle adjusting mechanism 64 about the rotation axis 64a, the ejecting angle of the gas clusters C can be controlled.

The second cluster nozzle 6 has the same structure as that of the first cluster nozzle 5. However, the second cluster nozzle 6 uses, as the cleaning gas, three gases including $O_3$ gas, HF gas, and $ClF_3$ gas. Therefore, as shown in FIG. 6, the base end side of the line connected to the second cluster nozzle 6 is branched, and the branched lines are connected to the supply systems 82 to 84 of the cleaning gases. The supply systems 82 to 84 of the cleaning gases are switched by the valve, and the cleaning gases are ejected while being mixed with Ar gas. A reference numeral '81' in the drawing represents an Ar gas supply system.

As shown in FIGS. 2 and 3, a purge gas nozzle 7 is provided above the wafer W in the second vacuum chamber 41, and is configured to allow a purge gas, e.g., Ar gas, to flow from a central portion toward an outer periphery of the wafer W at the ejecting location of the gas clusters C. The purge gas nozzle 7 can move in the X direction in FIG. 3 along a guide 71 via a supporting member 73 and a moving body 72, and is configured to eject the purge gas at a predetermined angle onto the surface of the wafer W adsorptively held by the electrostatic chuck 42. The purge gas nozzle 7 may be provided with an angle adjustment mechanism. The purge gas nozzle 7 is connected via a line to a purge gas supply system 80 provided outside the second vacuum chamber 41. The purge gas supply system 80 includes the purge gas supply source, the flow rate controller and the valve.

A gas exhaust line 49 is connected to a gas exhaust port 45 provided at the bottom portion of the second vacuum chamber 41. A vacuum pump 47 is provided at a gas exhaust line 49 via a pressure control unit 46, so that the pressure in the second vacuum chamber 41 can be controlled.

Next, the operation of the above-described embodiment will be described. First, a transfer container, e.g., a FOUP, accommodating wafers W is mounted on the loading/unloading stage 13, and the door 14 is opened together with the cover of the transfer container. Thereafter, the wafer W in the transfer container is transferred to the alignment module 16 by the transfer mechanism 12 in the atmospheric transfer chamber 1. Here, the direction of the wafer W is controlled to a preset direction. Then, the wafer W is loaded into the vacuum chamber 31 of the etching apparatus 3 via the transfer mechanism 12, the load-lock chamber 15, and the transfer mechanism 22 in the vacuum transfer chamber 2.

Figure 7A:
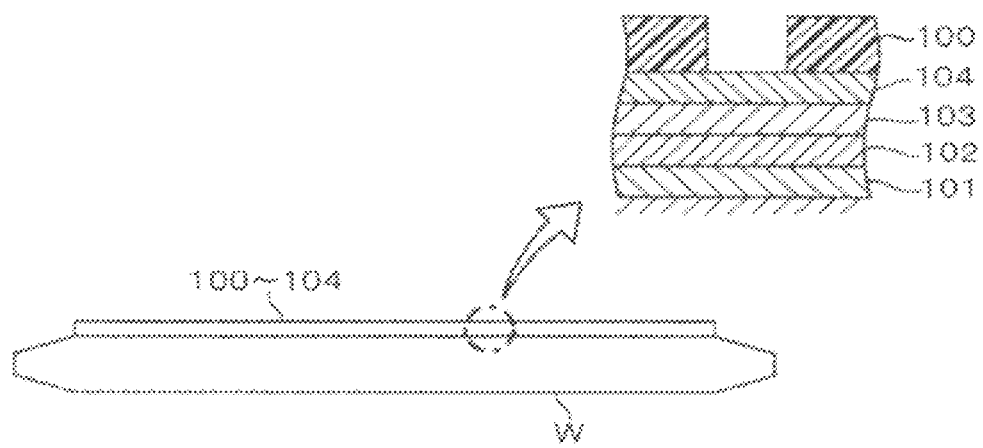
FIGS. 7A and 7B are vertical side views showing an outline of etching of laminated films formed on a wafer in the embodiment of the present invention.
Figure 7B:
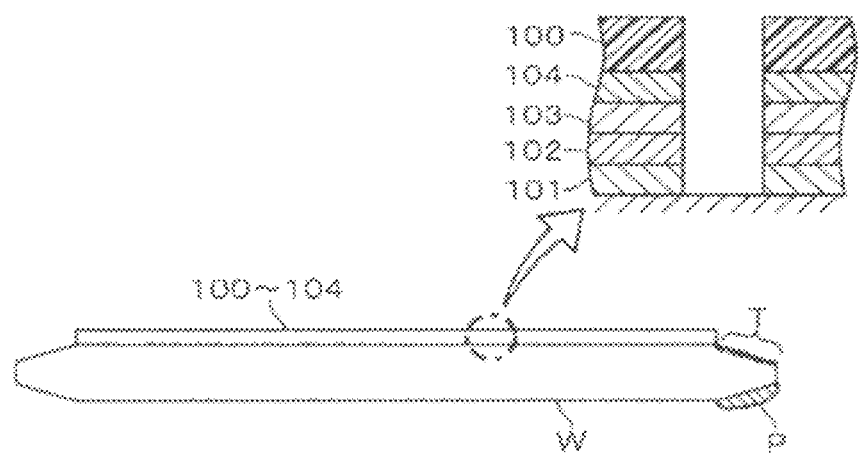

As shown in FIG. 7A, laminated films are formed on the surface of the wafer W, and a resist mask 100 is formed thereon. At the peripheral portion of the wafer W, the resist and the laminated films are removed and, thus, silicon as a base material of the wafer W is exposed. The laminated films include, e.g., a silicon oxide film 101, a polysilicon film 102, a metal film 103 made of titanium, tungsten or the like, and an organic film 104 which are formed in that order from the bottom. This is only an example of the laminated films which helps the understanding of the present invention. In the etching apparatus 3, a recess corresponding to a pattern of the resist mask 100 is formed by sequentially etching the laminated films by a plasma while varying processing conditions such as a processing gas, a pressure and the like depending on a type of each film. FIG. 7B is a schematic diagram of the etched wafer W. As shown in FIG. 7B, needle-shaped protrusions T which is unnecessary substances are formed at a beveled portion of the surface of the peripheral portion of the wafer W, and a deposit P such as a reaction product generated by etching which is unnecessary substances is deposited at a beveled portion of the backside of the wafer. The deposit P is a laminated structure of reaction products generated from each film of the laminated films. In this example, an organic-based reaction product, a metal-based reaction product, a silicon-based reaction product, and a CF-based reaction product are laminated in that order from the surface of the wafer W.

Next, the wafer W is loaded into the second vacuum chamber 41 of the substrate cleaning apparatus 4. The wafer W is adsorptively held by the electrostatic chuck 42 and rotated by the rotation mechanism. The second vacuum chamber 41 is maintained in a vacuum atmosphere of, e.g., about 1 Pa to 100 Pa, by the pressure control unit 46, and $ClF_3$ gas and Ar gas are supplied from the gas channels 55a and 55b, respectively, to the first cluster nozzle 5 at a pressure of about 0.3 MPa to 2.0 MPa by the flow rate controllers 59a and 59b. The concentration of the $ClF_3$ gas at this time is set to, e.g., a few vol %, by the flow rate controllers 59a and 59b. The $ClF_3$ gas and the Ar gas supplied to the first cluster nozzle 5 in a high pressure state are rapidly discharged by the first cluster nozzle 5 to the vacuum atmosphere of the second vacuum chamber 41. Thus, the gases are adiabatically expanded, and this makes the temperatures of the gases become lower than a condensation temperature. In this example, molecules are coupled by van des Waals force and form gas clusters C which are aggregates of atoms and/or molecules G.

Figure 8A:
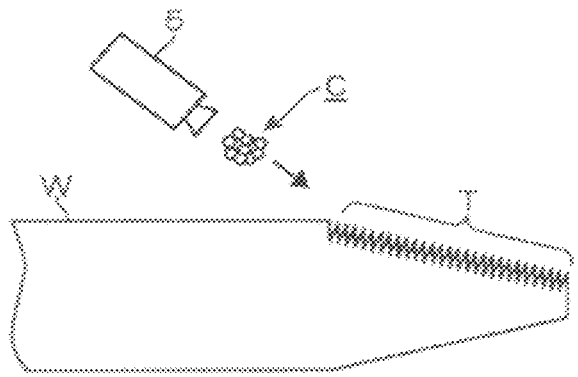
FIGS. 8A to 8D explain processes for planarizing needle-shaped protrusions formed at the peripheral portion of the wafer by using a first cluster nozzle in accordance with an embodiment of the present invention.
Figure 8B:
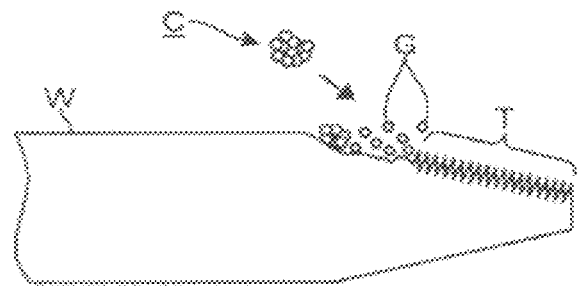
Figure 8C:
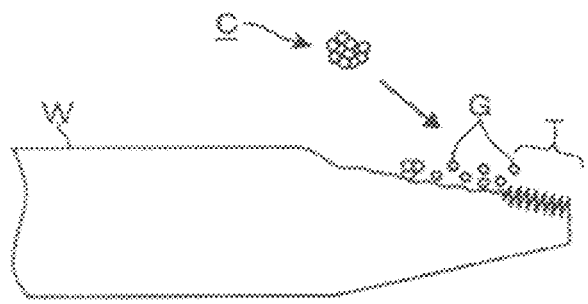
Figure 8D:
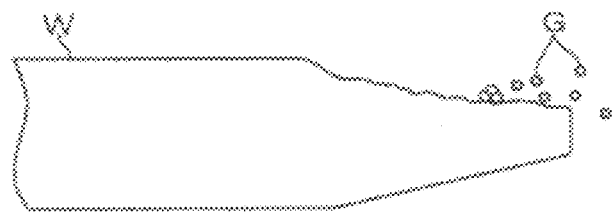

The gas clusters C is discharged from the first cluster nozzle 5 in an axial direction thereof (FIG. 8A), and collide with the needle-shaped protrusions T formed at the peripheral portion of the wafer W in a direction inclined with respect to the surface of the beveled portion. Accordingly, the gas clusters C is dissociated to individual atoms and molecules G. The dissociated gas atoms and molecules G are bounced at an angle close to parallel to the surface compared to the ejecting angle of the gas clusters (FIGS. 8B and 8C). The gas atoms and molecules G collide with the needle-shaped protrusions T and react with silicon. Due to the physical impact and the chemical reaction, the leading end portions of the needle-shaped protrusions T are cut, and the surface of the beveled portion of the peripheral portion of the wafer W is planarized (FIG. 8D). At this time, fine particles of silicon which are scattered from the surface of the wafer W are moved toward the outer periphery of the wafer W by the purge gas injected from the purge gas nozzle 7, and then are exhausted through the gas exhaust line 49 together with the gas atoms or molecules dissociated by the collision thereof with the wafer W. FIGS. 8A to 8D are image diagrams showing a state in which the needle-shaped protrusions T formed at the peripheral portion of the wafer W are planarized by the gas clusters C. A test to be described later has proven that the needle-shaped protrusions T are planarized by the ejection of the gas clusters C.

Figure 9A:
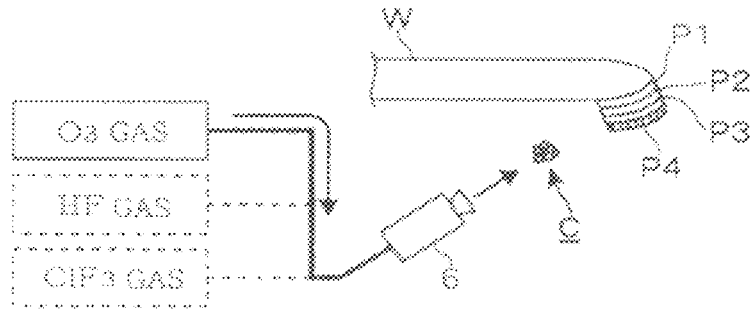
FIGS. 9A to 9D explain processes for removing a deposit by using a second cluster nozzle in accordance with an embodiment of the present invention.

Meanwhile, the removal of the deposit P by the second cluster nozzle 6 is performed together with the planarization of the needle-shaped protrusions T. The gas cluster ejection conditions, e.g., the atmospheric pressure of the second vacuum chamber 41, the pressure in the second cluster nozzle 6, the volume concentration of the cleaning gas and the like, are the same as the conditions of the first cluster nozzle 5 regardless of types of gases to be described later. First, a carbon fluoride-based deposit (CF-based deposit) P4 is removed as shown in FIG. 9A. For example, $O_3$ gas is introduced into the second cluster nozzle 6 at a predetermined flow rate controlled by the flow rate controller. Meanwhile, an inert gas, e.g., Ar gas, is introduced into the second cluster nozzle 6 at a flow rate controlled by the flow rate controller. The $O_3$ gas is mixed and diluted with the Ar gas in the second cluster nozzle 6. The cluster C of the $O_3$ gas is ejected from the second cluster nozzle 6 to collide with the deposit P adhered to the peripheral portion of the backside of the wafer W. At this time, the $O_3$ gas chemically reacts with the CF-based deposit P4 among the deposit P, and the CF-based deposit P4 is separated from the wafer W by the physical impact. The separated reaction product is purged by the purge gas, sucked by the vacuum pump 47 through the gas exhaust port 45, and discharged to the outside of the second vacuum chamber 41. As a consequence, the CF-based deposit P4 is removed from the peripheral portion of the wafer W.

Figure 9B:
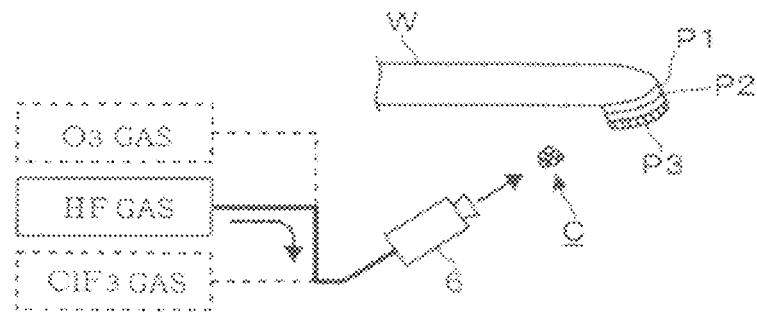

Next, the silicon-based deposit P3 is removed as shown in FIG. 9B. First, the cleaning gas supply system is switched, and the cleaning gas corresponding to the silicon-based deposit, e.g., HF gas, is introduced into the second cluster nozzle 6 at a predetermined flow rate controlled by the flow rate controller. Meanwhile, an inert gas, e.g., Ar gas, is introduced into the second cluster nozzle 6 at a flow rate controlled by the flow rate controller. Then, as in the case of removing the CF-based deposit P4, the silicon-based deposit P3 is removed by the physical and the chemical effect obtained by ejecting the cluster C of the HF gas to the deposit P.

Figure 9C:
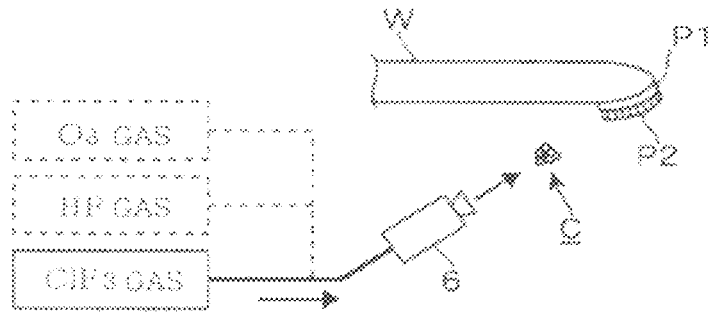

As in the case of removing the CF-based deposit P4 and the silicon-based deposit P3, the metal-based deposit P2 is removed by ejecting the gas clusters C of the cleaning gas corresponding to the metal-based deposit, e.g., $ClF_3$ gas, to the deposit P, as shown in FIG. 9C.

Figure 9D:
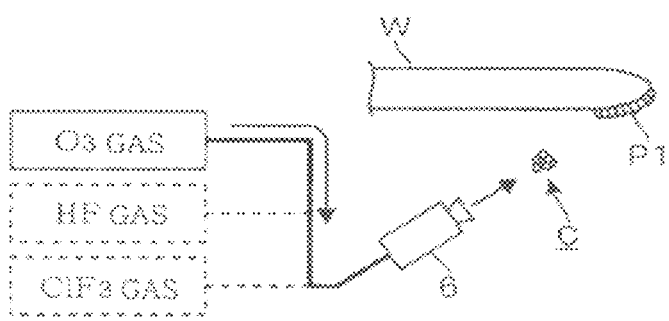

Lastly, the organic-based deposits P1 is removed by ejecting the gas clusters of the cleaning gas corresponding to the organic-based deposit, e.g., $O_3$ gas, to the deposit P, as shown in FIG. 9D. In this manner, the removal of the deposit P from the peripheral portion of the backside of the wafer W is completed.

In the present embodiment, $O_3$ gas is used as the cleaning gas for the CF-based deposit P4 and the organic-based deposit P1. However, it is also possible to use, e.g., alcohol gas, carbon fluoride gas (CF-based gas), $SF_6$ gas or the like, which can remove the organic-based deposit by chemical reaction. Moreover, as for the cleaning gas for the silicon-based deposit P3, it is possible to use, instead of HF gas, e.g., $F_2$ gas or the like. As for the cleaning gas for the metal-based deposit P2, it is possible to use, instead of $ClF_3$ gas, e.g., HF gas, $F_2$ gas, HCl gas, $Cl_2$ gas or the like.

During the cleaning of the beveled portion of the wafer W by the gas clusters C, the temperature of the wafer W is set to, e.g., a room temperature. Although the temperature of the wafer W is not particularly limited, it is preferably set to, e.g., about 0° C. to 100° C., in view of processing controllability.

Upon completion of the cleaning of the peripheral portion of the wafer W, the gate valve G3 is opened, and the wafer W is unloaded from the second vacuum chamber 41 by the transfer mechanism 22 of the vacuum transfer chamber 2.

In accordance with the above-described embodiment, in order to planarize the needle-shaped protrusions T formed at the peripheral portion of the surface of the wafer W and remove the deposit P as a composite film adhered to the peripheral portion of the backside of the wafer W, the cluster C of the cleaning gases corresponding to the respective cleaning processes is ejected to the peripheral portion of the wafer W while rotating the wafer W in a vacuum atmosphere. Due to the synergy between the physical action by the sputtering effect of the gas clusters C and the chemical action by the reactive gas, it is possible to planarize the needle-shaped silicon protrusions T and remove the deposit P as a composite film, as will be proved in the following test results.

At this time, the scattered materials generated by the cleaning can be prevented from being re-adhered to the wafer W by discharging the purge gas to the ejecting location toward the outer periphery of the wafer W. Further, since the gas clusters C can be locally ejected, the unnecessary substances (removal target portion) is exclusively cleaned without affecting the effective area such as the device area or the like of the wafer W. Therefore, the peripheral portion of the wafer W can be cleaned while reducing contamination of the wafer W. For example, when the plasma is locally ejected, the plasma supply nozzle may be damaged and result in contamination. However, in the case of using the gas clusters C, such problems do not occur, and the apparatus has a simple and cost-effective structure.

In the above-described embodiment, the first and the second cluster nozzle 5 and 6 are provided with the angle adjusting mechanisms 54 and 64. Hence, the time period during which the gas clusters C is discharged may be divided into a plurality of time periods. For example, the ejecting angle may be switched in a stepwise manner such that the gas clusters C is discharged at a first angle during a first time period and at a second angle during a second time period. Or, the ejecting angle may be consecutively switched between the first angle and the second angle such that the cluster nozzles 5 and 6 repeat so-called swinging operations during the cleaning process.

The first and the second cluster nozzle 5 and 6 can move in the X direction. Thus, the ejecting location in the diametrical direction of the wafer W may be switched between the first time period and the second time period, or the diametrical locations of the cluster nozzles 5 and 6 may be consecutively switched. For example, the cluster nozzles 5 and 6 may reciprocate between the first location and the second location. Besides, both of the angles of the cluster nozzles 5 and 6 and the diametrical location of the wafer W can be changed.

Figure 10:
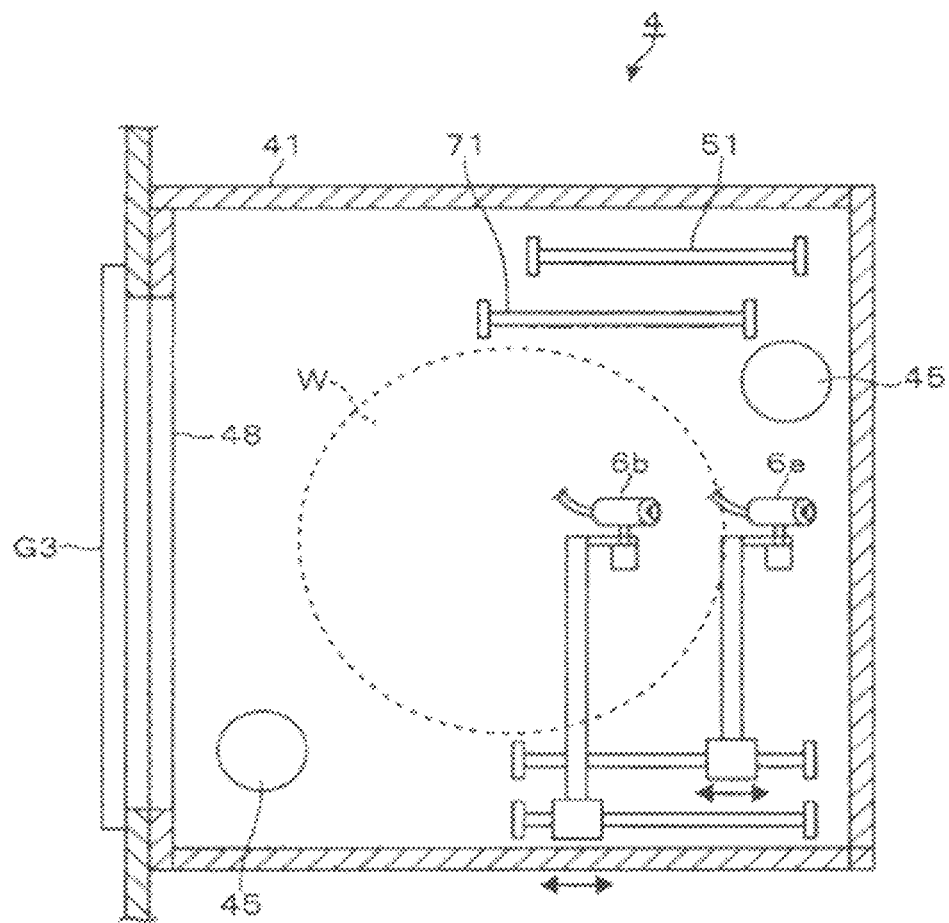
FIG. 10 is a top view showing an outline of a substrate cleaning apparatus in accordance with a modification of the embodiment of the present invention.

In the above-described embodiment, different types of gases are provided by a single second cluster nozzle 6. However, the present invention may provide a plurality of second cluster nozzles 6a and 6b for each type of gases, as shown in FIG. 10. In FIG. 10, the first cluster nozzle 5, the purge gas nozzle 7, the supporting members 53 and 73 and the like are not illustrated for simplicity of the drawing, and only the guides 51 and 71 are illustrated.

In the above-described embodiment, all the components of the deposit P adhered to the peripheral portion of the wafer W are removed. However, the deposit may be removed in accordance with the state required in a next step. In some cases, only a part of the components may be removed.

In the above-described embodiment, a plurality of cleaning gases corresponding to a plurality of components of the deposit P is sequentially ejected from the same cluster nozzle. However, the gas clusters C of the respective gases may be ejected together to the same location by a plurality of cluster nozzles for the respective cleaning gases.

In the above-described embodiment, both of the needle-shaped protrusions T and the deposit P are cleaned by the gas clusters. However, only the needle-shaped protrusions T may be removed by the gas clusters, and the deposit P may be removed by another method, e.g., wet etching or the like.

In the above-described embodiment, the present invention is applied to the cleaning of the needle-shaped protrusions T and the deposit P formed at the peripheral portion of the wafer W. However, the present invention is not limited thereto, and may also be applied to, e.g., the case of removing a peripheral portion of a thin film formed on the wafer W by CVD.

In the above-described embodiment, the cleaning is performed by the gas clusters in a vacuum atmosphere. However, the cleaning atmosphere may be an atmosphere having a pressure lower than the pressure in the cluster nozzle, or may be a normal pressure atmosphere.

A target substrate to be processed is not limited to a circular substrate such as a wafer W, and may also be a rectangular substrate, e.g., a flat panel display (FPD) substrate or the like. In that case, it is possible to employ a method for performing processing while relatively moving the cluster nozzles 5 and 6 with respect to the substrate from one end to the other end of peripheral sides of the substrate.

[Test]

Hereinafter, a test example of the present invention which has proven the effect of the planarization of the needle-shaped silicon protrusions and the removal of the deposit from the backside of the substrate will be described.

(Planarization of Needle-Shaped Silicon Protrusions)

Figure 11A:
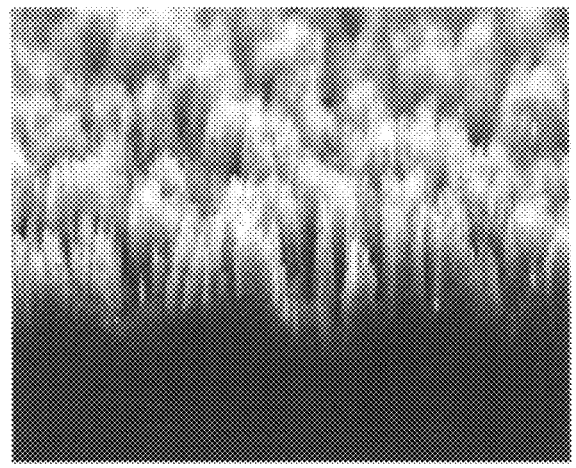
FIGS. 11A and 11B are SEM pictures showing wafer surfaces before and after ejection of gas clusters on a wafer having needle-shaped protrusions formed on a surface thereof in a test example of the present invention.
Figure 11B:
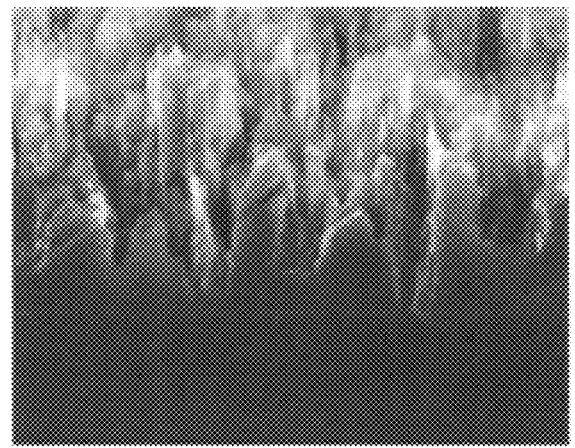

A silicon piece having needle-shaped protrusions formed on a surface thereof by a plasma was prepared. As for a processing gas, $ClF_3$ gas (about 6 vol %) and Ar gas were used. A pressure in the gas cluster nozzle was set to about 0.8 MPa, and an atmosphere in the vacuum chamber was set to about 10 Pa. An ejecting angle of the gas clusters with respect to the silicon piece was set to about 45°. In that state, the gas clusters are ejected to the surface of the silicon piece. FIG. 11 shows surfaces of the silicon piece observed by SEM before and after the ejection of the gas clusters. As a result of this test, it was found that the leading end portion of the needle-shaped protrusions were planarized by the ejection of the gas clusters.

(Removal of Deposit)

A tungsten film, a $SiO_2$ film, and a resist film as an organic film, each corresponding to a metal-based deposit, a silicon-based deposit, and an organic-based deposit were formed on a surface of the substrate. Gas clusters was ejected in a direction perpendicular to the substrate, and the trace of the ejection was observed by naked eyes to determine whether or not the present invention may be applied. $ClF_3$ gas (about 6 vol %) diluted with Ar gas was ejected to the tungsten film; HF gas (about 5 vol %) diluted with Ar gas and O3 gas (about 5 vol %) diluted with Ar gas were ejected to the $SiO_2$ film and the resist film, respectively. When the gas was ejected to the resist film, the test was performed while setting the temperature of the substrate to about 90° C. and to a room temperature. The trace of the ejection was found in the tungsten film and the $SiO_2$ film, which has proven that the etching of the present invention is applicable. In the case of the resist film, when the substrate was set to a room temperature, the trace of the ejection was not found. However, when the substrate was set to about 90° C., it was found that the etching of the present invention is applicable.

While the invention has been shown and described with respect to the embodiments, it will be understood by those skilled in the art that various changes and modification may be made without departing from the scope of the invention as defined in the following claims.

What is claimed is:

1. A substrate cleaning apparatus comprising:
   a processing chamber comprising a gas exhaust port;
   a supporting unit configured to support a substrate, said supporting unit being provided in said processing chamber;
   one or more nozzle units, each configured to eject gas clusters-to remove unnecessary substances from the substrate; and
   a moving mechanism configured to change relative positions of the supporting unit and the nozzle units during ejecting the gas clusters,
   wherein each nozzle unit discharges a cleaning gas having a pressure higher than that in the processing chamber so that the cleaning gas is adiabatically expanded to form aggregates of atoms and/or molecules,
   wherein said substrate cleaning apparatus further comprises a cleaning gas supply source for supplying said cleaning gas, a flow rate control unit for controlling a flow rate of said cleaning gas, a first gas channel through which said cleaning gas is supplied and a second gas channel through which a pressure increasing gas is supplied,
   wherein each nozzle unit comprises a pressure chamber to which said first and said second gas channels are connected,
   wherein said nozzle units comprise a nozzle unit disposed below said substrate, and
   wherein said pressure chamber comprises a base end side to which said first and said second gas channels are connected and a leading end side having a discharge port facing said substrate and configured to eject said gas clusters thereto.

2. The substrate cleaning apparatus of claim 1, further comprising a purge gas supply unit, disposed at a side of a front surface of the substrate, for discharging a purge gas for outwardly blowing scattered materials, the scattered materials being produced from the substrate due to collision thereof with the gas clusters.

3. The substrate cleaning apparatus of claim 1, wherein the cleaning gas is discharged from each nozzle unit after being mixed with said pressure increasing gas in said pressure chamber.

4. The substrate cleaning apparatus of claim 1, wherein at least one of said nozzle units is configured to change an ejecting angle of the gas clusters with respect to the substrate.

5. The substrate cleaning apparatus of claim 1, wherein at least one of said nozzle units is configured to move in a radial direction of the substrate.

6. The substrate cleaning apparatus of claim 1, wherein at least one of said nozzle units is configured to change an ejecting angle of said gas clusters by being rotated about an axis parallel with said substrate and/or to move in a radial direction of said substrate, and
   further comprising a control unit which is programmed to control said at least one of said nozzle units to perform at least one of changing said ejecting angle of the gas clusters and moving in said radial direction of the substrate during ejecting the gas clusters.

7. The substrate cleaning apparatus of claim 1, wherein the substrate has a circular shape, and
the moving mechanism is a rotation mechanism for rotatively supporting the substrate about a central axis of the substrate.

8. The substrate cleaning apparatus of claim 1, further comprising
the substrate disposed on said supporting unit,
wherein said substrate is a silicon wafer obtained after etching various laminated films formed thereon,
the unnecessary substances include a plurality of needle-shaped silicon protrusions formed at a peripheral portion of a front surface of the substrate, and various thin films adhered to the peripheral portion of a back surface of the substrate, and
wherein said nozzle units comprise a nozzle unit, which is disposed above said substrate and configured to eject said gas clusters towards said needle-shaped silicon protrusions.

9. The substrate cleaning apparatus of claim 1, wherein
the unnecessary substances include various laminated films formed on a peripheral portion of at least one of a front surface and a back surface of the substrate, and
at least one of said nozzle units is connected to a gas supply system supplying various cleaning gases so that said various cleaning gases are switchably discharged.

10. The substrate cleaning apparatus of claim 1, wherein
the unnecessary substances include various laminated films formed on a peripheral portion of at least one of a front surface and a back surface of the substrate, and
the number of the nozzle units is greater than one and the nozzle units discharge different cleaning gases.

11. A vacuum processing system comprising:
a vacuum transfer chamber for transferring a substrate in a vacuum atmosphere;
a vacuum processing module, connected to a vacuum transfer chamber via a gate valve, for forming a thin film on a substrate or performing dry etching on a thin film formed on the surface of the substrate; and
the substrate cleaning apparatus described in claim 1, connected to the vacuum transfer chamber via a gate valve, for cleaning a peripheral portion of the substrate.

12. The substrate cleaning apparatus of claim 6, wherein said at least one of said nozzle units is configured to change said ejecting angle of said gas clusters by being rotated about an axis parallel with said substrate.

13. The substrate cleaning apparatus of claim 1, wherein the nozzle units are provided inside the processing chamber.

* * * * *